(12) United States Patent
Jemili et al.

(10) Patent No.: US 11,531,041 B2
(45) Date of Patent: Dec. 20, 2022

(54) SENSOR SYSTEM, INCLUDING A PLURALITY OF INDIVIDUAL AND SEPARATE SENSOR ELEMENTS

(71) Applicant: Robert Bosch GmbH, Stuttgart (DE)

(72) Inventors: Amin Jemili, Kusterdingen (DE); Joerg Braeuer, Nehren (DE); Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/221,362

(22) Filed: Apr. 2, 2021

(65) Prior Publication Data

US 2021/0325422 A1 Oct. 21, 2021

(30) Foreign Application Priority Data

Apr. 15, 2020 (DE) ...................... 10 2020 204 773.1

(51) Int. Cl.
| | | |
|---|---|---|
| *G01P 15/08* | (2006.01) | |
| *G01P 15/03* | (2006.01) | |
| *B81B 7/02* | (2006.01) | |

(52) U.S. Cl.
CPC ............ G01P 15/0802 (2013.01); B81B 7/02 (2013.01); G01P 15/03 (2013.01)

(58) Field of Classification Search
CPC ...... G01P 15/18; G01P 15/0802; G01P 15/03; G01P 1/023; G01P 1/02; G01C 19/5769; B81B 7/02

See application file for complete search history.

(56) References Cited

U.S. PATENT DOCUMENTS

| | | | |
|---|---|---|---|
| 6,195,154 B1 * | 2/2001 | Imai ..................... | G03F 9/7034 356/400 |
| 2006/0082463 A1 | 4/2006 | Sri-Jayantha et al. | |
| 2006/0148137 A1 * | 7/2006 | Hartzell ............... | B81C 1/0023 438/149 |
| 2006/0208326 A1 | 9/2006 | Nasiri et al. | |
| 2007/0202627 A1 | 8/2007 | Minervini | |
| 2008/0043212 A1 * | 2/2008 | Shibazaki ........... | G03F 7/70191 355/72 |
| 2010/0092020 A1 | 4/2010 | Ryan et al. | |
| 2012/0267730 A1 * | 10/2012 | Renard ................ | B81B 7/0064 438/51 |
| 2013/0040423 A1 * | 2/2013 | Tung ...................... | H01L 21/78 257/E21.602 |
| 2013/0258306 A1 * | 10/2013 | Huang .................. | G03F 9/7003 356/399 |

(Continued)

FOREIGN PATENT DOCUMENTS

| | | |
|---|---|---|
| CN | 102595295 A | 7/2012 |
| DE | 19616014 A1 | 10/1997 |
| DE | 102010040370 A1 | 3/2012 |

*Primary Examiner* — Helen C Kwok
(74) *Attorney, Agent, or Firm* — Norton Rose Fulbright US LLP; Gerard Messina

(57) ABSTRACT

A sensor system including a plurality of individual and separate sensor elements. Each of the individual sensor elements is independently functional. The individual sensor elements of the sensor system being formed in one piece from parts of a wafer or a vertically integrated wafer stack. The sensor system including at least one separation structure, in particular a scribe line, between the individual and separate sensor elements.

11 Claims, 5 Drawing Sheets

(56) References Cited

U.S. PATENT DOCUMENTS

| | | | |
|---|---|---|---|
| 2014/0084397 A1* | 3/2014 | Ziglioli | B81B 7/007 |
| | | | 257/419 |
| 2014/0353775 A1* | 12/2014 | Formosa | H01L 24/97 |
| | | | 438/51 |
| 2015/0303178 A1* | 10/2015 | Liu | H01L 24/19 |
| | | | 438/107 |
| 2016/0075554 A1* | 3/2016 | Huang | B81C 1/00309 |
| | | | 438/51 |
| 2016/0079216 A1* | 3/2016 | Hosomi | H01L 21/6835 |
| | | | 257/738 |
| 2016/0185593 A1* | 6/2016 | Cachia | H01L 24/97 |
| | | | 257/773 |
| 2016/0214857 A1* | 7/2016 | Lin | B81B 7/007 |
| 2016/0347609 A1* | 12/2016 | Yu | B81C 1/00238 |
| 2017/0025383 A1* | 1/2017 | Kato | H01L 25/0655 |
| 2018/0230004 A1* | 8/2018 | Pan | H01L 24/97 |
| 2021/0173467 A1* | 6/2021 | Bell | G06F 1/1658 |
| 2021/0392269 A1* | 12/2021 | Hosseinimakarem | G01C 21/16 |

\* cited by examiner

SENSOR SYSTEM, INCLUDING A PLURALITY OF INDIVIDUAL AND SEPARATE SENSOR ELEMENTS

CROSS REFERENCE

The present application claims the benefit under 35 U.S.C. § 119 of German Patent Application No. DE 102020204773.1 filed on Apr. 15, 2020, which is expressly incorporated herein by reference in its entirety.

FIELD

The present invention is directed to a sensor system including a plurality of individual and separate sensor elements.

BACKGROUND INFORMATION

Sensor systems, in particular micromechanical sensor systems, are generally available; micromechanical sensors for measuring, for example, acceleration, rotation rate, pressure, and other physical variables are thus manufactured in mass production for various applications in the automotive and consumer fields. One important trend in the refinement of sensors is the improvement of the performance. In some applications, above all a significant reduction of the noise has great importance. Other applications require a massive reduction of offset or sensitivity errors.

Performance improvements are fundamentally achievable by new development of improved sensors, for example by optimized MEMS elements, improved evaluation circuits (ASICs), measures taken in the packaging, or also during the calibration/testing of the sensors. However, very high development costs are required depending on the complexity of the improvement measure, in particular if disruptive and not only incremental improvements of the performance are required.

For example, a lower-noise signal may be achieved by evaluating the signals of multiple sensor elements, as is described, for example, in U.S. Patent Application Publication No. US 2006/0082463 A1; however, it is disadvantageous here that a relatively high expenditure is required for the overall system integration and the installation size interdicts a use in size-sensitive applications or at least makes it much more difficult.

Furthermore, methods of vertical integration are available, in which a MEMS wafer or a wafer including a micromechanical sensor structure is bonded on an ASIC wafer or a wafer including an associated evaluation circuit or both are connected to one another, in particular the ASIC wafer implementing both the electronic evaluation circuit and also the cap for the micromechanical sensor structure of the MEMS element, cf., for example, German Patent Application No. DE 19 616 014 A1 or U.S. Patent Application Publication No. US 2006/0208326 A1.

SUMMARY

A sensor system according to an example embodiment of the present invention may have the advantage over the related art that by using a plurality of individual and separate sensor elements (or individual sensor elements) within the sensor system—i.e., in particular by using an array (of at least 2×1, in general n×m) identical semiconductor components, each individual semiconductor component being independently functional—the plurality of individual and separate sensor elements, i.e., the array, being formed in one piece from parts of a wafer (or substrate) or from parts of two wafers (or two substrates), it is not only possible to achieve an improved signal quality (performance) of the entire sensor system, but also to reduce the development expenditure or to achieve flexibility in the development so that niche applications, for example having increased performance demands, for which a separate product development (due to high development costs at minor quantity) would not be cost-effective, are efficiently operable. It is thus possible according to the present invention to implement high-performance sensors, which are scalable in a simple manner with respect to performance, with low development costs and small installation size at the same time.

Advantageous designs and refinements of the present invention may be inferred from the present disclosure, including the description herein with reference to the figures.

According to an example embodiment of the present invention, it is in particular preferably provided that the individual and separate sensor elements of the sensor system—with the exception of the connection via the substrate potential—are exclusively or at least essentially solely mechanically connected to one another, in particular are exclusively mechanically connected or are only electrically connected to one another via a redistribution level situated on a side of the second substrate facing away from the first substrate (or also situated on a side of the first substrate facing away from the second substrate). Because the individual and separate sensor elements are exclusively mechanically or essentially solely mechanically connected to one another, it is advantageously possible according to the present invention to group or combine the various sensor elements in different ways into sensor systems (or into different types of arrays of sensor elements) (or—in the case of a redistribution level—the effort for implementing different sensor systems (or different arrays of sensor elements) is significantly reduced, because only the redistribution level is to be adapted if necessary).

In particular, in accordance with an example embodiment of the present invention, it is furthermore provided that the individual and separate sensor elements include a vertically integrated wafer stack made up of a first chip arrangement including the micromechanical sensor structure and the first substrate and a second chip arrangement including the associated evaluation circuit and the second substrate. In this way, it is advantageously possible according to the present invention that both a cap of the micromechanical sensor structure is implemented by the evaluation circuit and at the same time the evaluation circuit associated with a sensor structure is situated in spatial proximity, so that different arrays of sensor elements and thus the flexibility according to the present invention are possible during the development of new configurations (or types of arrays of individual sensor elements) of the sensor system. The implementation of vias, in particular in the form of TSV (through-silicon vias) advantageously enables the electrical connection between the first and second substrate and/or between the first and second chip arrangement, so that either electrical signals of the micromechanical sensor structure (MEMS signals) or electrical signals of the evaluation circuit (ASIC signals) may be led from the inside of the wafer stack to the outside of the stack. It is furthermore preferred according to the present invention that the sensor system according to the present invention including a plurality of individual and separate sensor elements is usable as a so-called chip scale package, i.e., the footprint of the sensor system is defined by the size of the plurality of individual and separate sensor elements and no further housing or secondary packaging of the sensor system takes place. The sensor system according to the present invention, i.e., an array of individual and separate sensor elements (or of equivalent individual semiconductor components) may preferably—in particular as a chip scale package—be provided, for example, so it may be directly soldered on a circuit board or is vertically stackable via flip-chip mounting on another chip or an interposer or a lead frame or a package substrate. Furthermore, it is preferred that each of the individual sensor elements is independently functional and in particular the individual sensor elements of the sensor system are formed in one piece from parts of one wafer in each case with respect to their first and second chip arrangement and/or with respect to their first and second substrate.

It is furthermore preferred according to an example embodiment of the present invention that the sensor system includes an electrical carrier which extends essentially in parallel to the main extension planes of the substrates, the individual and separate sensor elements being mechanically connected to the electrical carrier, in particular the electrical carrier including electrical strip conductors and/or a further redistribution level. It is advantageously possible in this way that the individual semiconductor components of the array (i.e., the individual sensor elements) are individually addressable via a bus system, for example via a microcontroller, so that a suitable weighted averaging of the signals of the individual semiconductor components may be carried out in the microcontroller. The further redistribution level (on the electrical carrier) is used in particular for electrically interconnecting identical pins of the individual semiconductor components (individual sensor elements) and may either take place, for example, on the carrier element for the flip-chip mounting (for example, a circuit board or a microcontroller ASIC) or may already be implemented by a dedicated metallic redistribution on the array (i.e., as part of the above-mentioned redistribution level situated on the side of the second substrate facing away from the first substrate (or on the side of the first substrate facing away from the second substrate)); alternatively, this functionality may also be implemented both via the redistribution level and via the further redistribution level. In particular upon use of the redistribution levels (on the outer surface of the first or second substrate), the redistribution may also be carried out in such a way that the array may be electrically contacted via wire bonds; the individual semiconductor components (i.e., individual sensor elements) within the array are no longer completely identical in this case, but rather differ with respect to their redistribution on the contacting side.

According to an example embodiment of the present invention, it is preferred in particular that the individual and separate sensor elements or at least a part of the individual and separate sensor elements are equivalent sensor elements or identical sensor elements (in particular situated in terms of an array), in particular micro-electromechanical components (MEMS components), in particular in the form of inertial sensor elements (for example, for measuring the linear acceleration in one, two, or three spatial directions and/or for measuring the rotational acceleration or rotation rate, also around axes of rotation in one, two, or three spatial directions) or temperature sensor elements or pressure sensor elements or actuator elements coming into consideration.

With respect to the operation of the sensor system according to the present invention, it is preferred according to an example embodiment of the present invention that it is configured with respect to the evaluation of the individual and separate sensor elements in such a way that arithmetic averaging of the measured values of these individual and separate sensor elements is carried out, and/or weighted averaging of the measured values of these individual and separate sensor elements is carried out. For example, it may be advantageous that at a first point in time, an arithmetic averaging is carried out and at a second point in time, a weighted averaging of the measured values is carried out.

Exemplary embodiments of the present invention are shown in the figures and explained in greater detail in the description below.

DETAILED DESCRIPTION OF EXAMPLE EMBODIMENTS

In the various figures, identical parts are provided with identical reference numbers and are therefore generally each only named or mentioned once.

Figure 1:
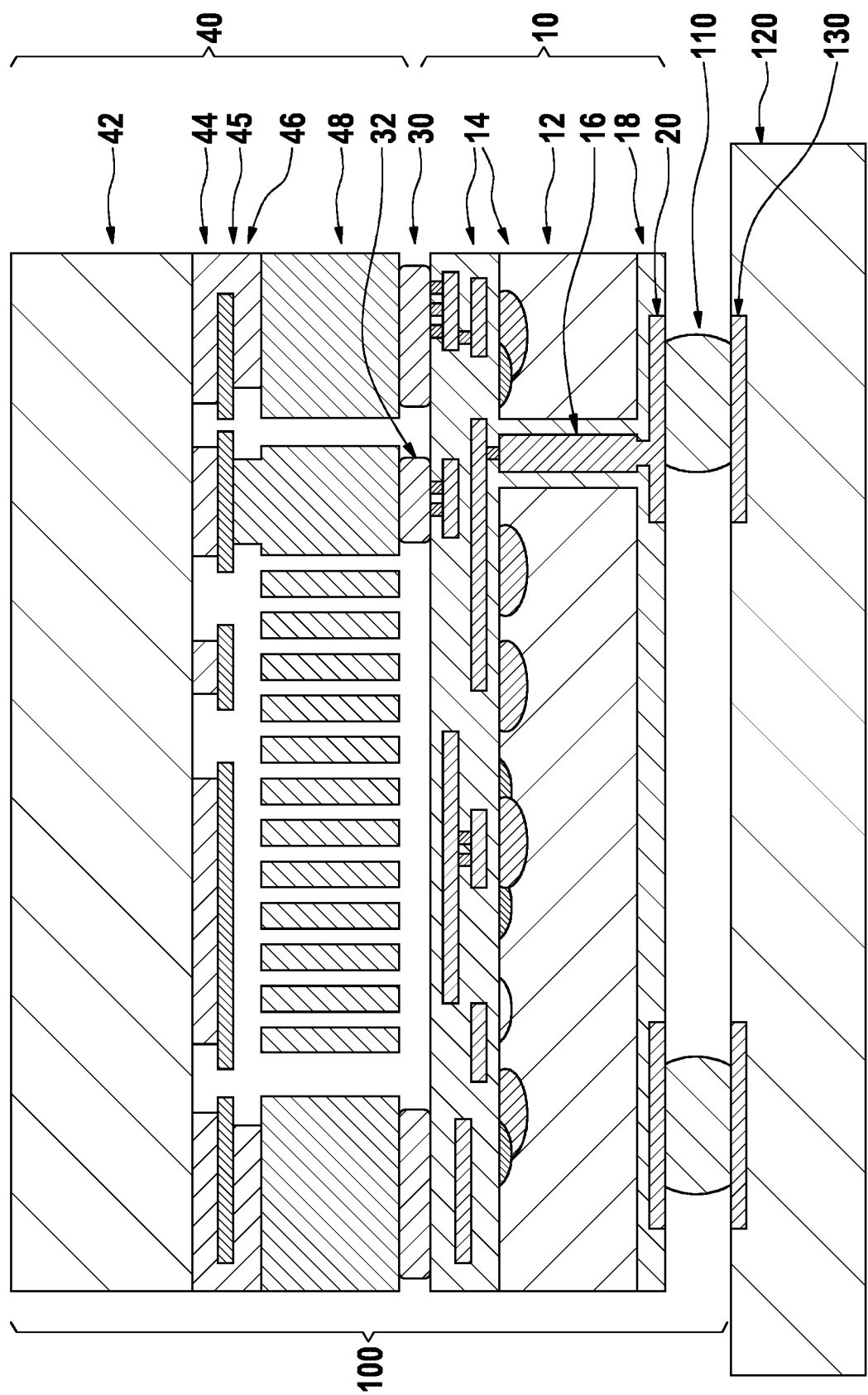
FIG. 1 shows a schematic side view as a sectional illustration of an individual and separate sensor element of a sensor system according to an example embodiment of the present invention.

A schematic side view is shown as a sectional illustration of an individual and separate sensor element 100 of a sensor system 200 according to the present invention (cf. FIG. 2) in FIG. 1 as an exemplary specific embodiment. FIG. 1 thus shows the basic structure of an individual sensor element according to the present invention, sensor system 200 including a plurality of such sensor elements 100 or individual sensor elements 100, in particular a plurality of such sensor elements 100 which are constructed similarly or identically. Individual sensor element 100 is implemented in particular as a so-called ASICAP-MEMS component 100, i.e., it includes a first substrate 42 having a micromechanical sensor structure, formed or implemented in (or primarily in) a micromechanical functional layer 48, and a second substrate 12 having an associated evaluation circuit 14. Substrates 42, 12 include main extension planes which are situated essentially in parallel to one another, first and second substrate 42, 12 being mechanically and electrically connected to one another (i.e., in the "vertical" direction, i.e., perpendicular to the main extension planes) and first and second substrate 42, 12 overlap in a direction perpendicular to the main extension planes or form an at least partially sealed cavity, within which in each case the micromechanical sensor structure or functional layer 48 of individual sensor elements 100 is situated. One such sensor element 100 includes in particular an ASIC chip 10 (or second chip arrangement) and a MEMS chip 40 (or first chip arrangement), first and second chip arrangement 40, 10 (or first and second substrate 42, 12) being mechanically connected to one another in particular via a metallic bond connection 30 (and in particular hermetically sealing an enclosed cavity). Bond connection 30 seals off the chip, in particular hermetically, at outer bond frame 30 and optionally additionally provides electrical contacts 32. MEMS chip 40 or first chip arrangement 40 may be manufactured, for example, using surface-micromechanical methods according to the related art and includes a MEMS wafer substrate 42 (first substrate 42) and (exemplary) oxide layers 44, 46, a silicon redistribution level 45, and a micromechanical functional layer 48. The ASIC or second chip arrangement 10 includes an ASIC wafer substrate 12 (second substrate 12) and functional layers (not differentiated in greater detail) for transistors and redistribution, i.e., for implementing the circuit functionality of the ASIC. ASIC component 100 or individual sensor element 100 furthermore includes vias 16 (or TSVs (through-silicon vias) 16), with the aid of which first and second substrate 42, 12 (or first and second chip arrangement 40, 10) are connected to one another and/or first or second substrate 42, 12 is electrically connected to an outside of first or second substrate 42, 12 facing away from the particular other substrate (for the first substrate 42 (from its inside facing toward second substrate 12) to its outside, which faces away from second substrate 12, or for second substrate 12 (from its inside facing toward first substrate 42) to its outside, which faces away from first substrate 42. In this way, it is possible according to the present invention in particular to lead ASIC signals to the rear side of the ASIC (of second chip arrangement 10) (or vice versa to lead signals of MEMS chip 40 (of first chip arrangement 40) to its rear side (this last-mentioned alternative not being shown in FIG. 1). Passivation layers 18 and a redistribution level (RDL, redistribution layer) 20 are located on the rear side of the ASIC or second chip arrangement 10. Solder balls 110 may be situated by a suitable metallization of pad areas with the aid of an under-bump metallization (UBM, not shown separately), which are soldered with the aid of soldering on an electrical carrier 120 (which is provided with contact pads 130). Electrical carrier 120 is typically a circuit board, but it may also be an interposer or an active semiconductor chip.

Figure 2:
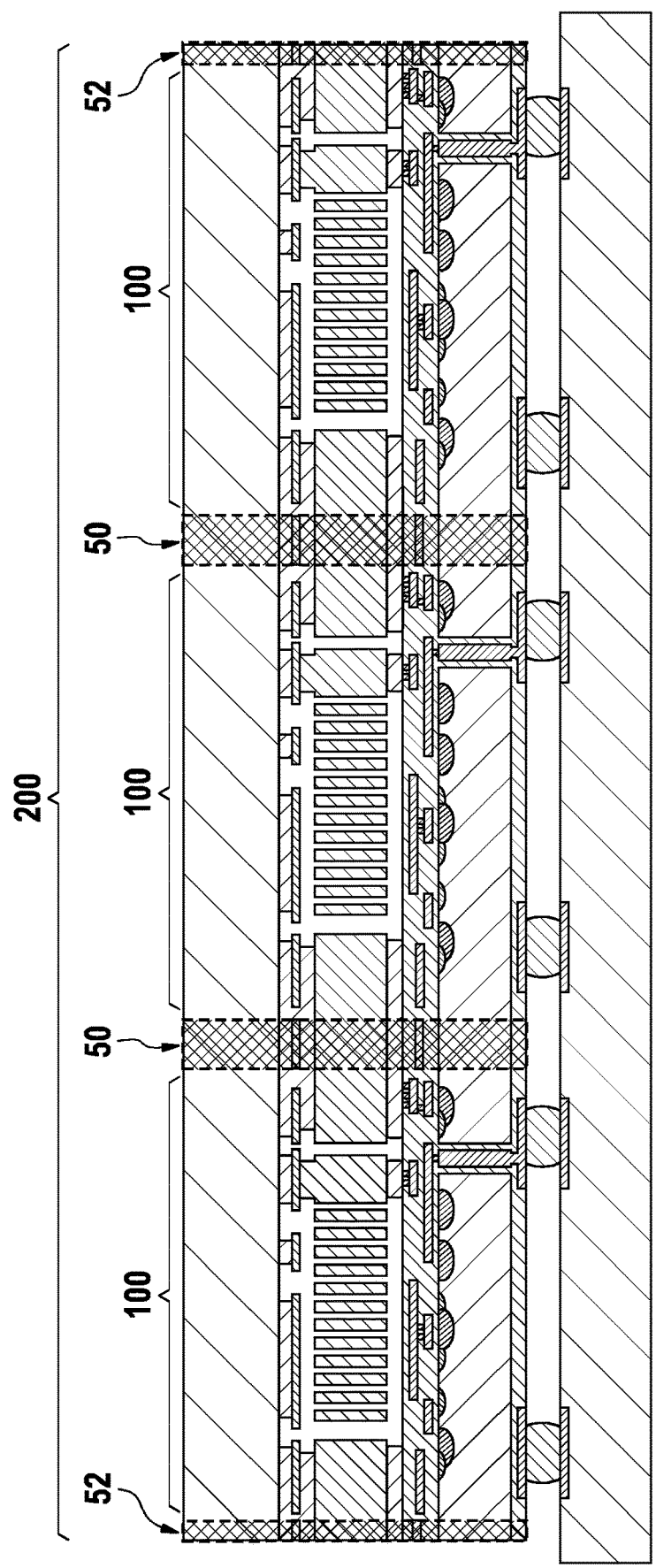
FIG. 2 shows a schematic side view as a sectional illustration of the sensor system according to an example embodiment of the present invention, implemented for the example of a 1×3 array.

FIG. 2 shows a schematic side view as a sectional illustration of sensor system 200 according to the present invention, implemented for the example as a 1×3 array, i.e., of three individual sensor elements 100 (or of ASICAP components) situated adjacent to one another. Single individual sensor elements 100 (or ASICAP components) may be, for example, acceleration sensors, rotation rate sensors, pressure sensors, temperature sensors, actuators, in particular micromechanical actuators, or the like. Scribe lines 50 are located between individual sensor elements 100 (or ASICAP components). Except for the substrate potential, individual chips (or individual sensor elements 100) of array 200 (or of (entire) sensor system 200) are therefore only mechanically, but not electrically, connected to one another. This applies in particular according to one specific embodiment without redistribution level 20 (which includes or implements electrical connections between multiple individual sensor elements 100 (or ASICAP components)) as part of second substrate 12. In an alternative specific embodiment with a redistribution level 20 (which is implemented in such a way that it includes or implements electrical connections between multiple individual sensor elements 100), this no longer strictly applies; nonetheless even in such a specific embodiment, individual sensor elements 100 are in any case not electrically connected to one another "in the interior" of individual sensor elements 100, i.e., in this case a redistribution level 20 is only situated on the outside of either first substrate 42 or second substrate 12 (i.e., on the side of second substrate 12 facing away from first substrate 42 or on the side of first substrate 42 facing away from second substrate 12), with the aid of which individual sensor elements 100 (or ASICAP components) are electrically connected to one another. Scribe line 52 is significantly reduced in its width by the separation process at the outer edge of array 200 or sensor system 200.

The exemplary embodiments of FIGS. 1 and 2 show micromechanical components, in particular micromechanical components which are formed from a vertically integrated wafer stack. This represents a preferred implementation of the present invention; however, it is not required according to the present invention that individual and separate sensor elements 100 are micromechanical components, and furthermore, it is also not required that individual and separate sensor elements 100 are formed from a vertically integrated wafer stack.

It is thus possible according to the present invention that individual and separate sensor elements 100 are semiconductor components, which are solely formed from a wafer or ASIC wafer substrate 12 and are manufactured using methods which are conventional in semiconductor manufacturing, for example, the manufacturing of CMOS wafers. One example of this is an integrated temperature sensor as individual and separate sensor element 100, in which the temperature is sensed via a resistance measurement, the temperature-sensitive resistors, for example, being formed by doped piezoresistive silicon structures or metal strip conductors. Individual and separate sensor elements 100 each contain an evaluation circuit for reading out the resistors, for signal processing and/or communication. In this case, no special micromechanical manufacturing methods are required. A separate visual representation is therefore omitted for the sake of simplicity.

Furthermore, it is possible in terms of the present invention that individual and separate sensor elements 100 are micromechanical semiconductor components, which are not formed from a vertically integrated wafer stack, but rather from an individual wafer or ASIC wafer substrate 12, to which, however, additional micromechanical process steps are applied. For example, in addition to the process steps required for manufacturing the evaluation circuit, special layer depositions and/or etching methods for implementing MEMS structures on ASIC wafer substrate 12 may be applied in order, for example, to form movable structures for integrated inertial sensors or diaphragms for integrated pressure sensors. A separate visual representation is also omitted for the sake of simplicity.

Figure 3:
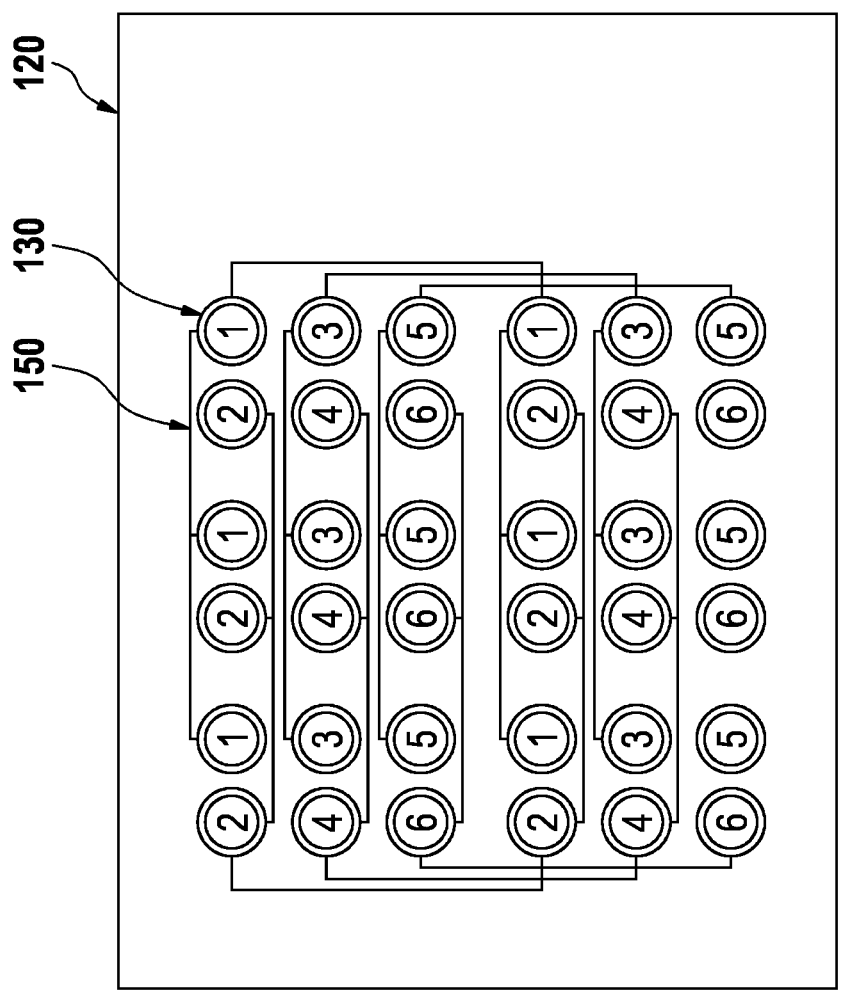
FIG. 3 shows a schematic top view of the electrical carrier or the outer side of the first or second substrate of the sensor system according to an example embodiment of the present invention, implemented for the example of a 2×3 array, for a first specific embodiment of the present invention.
Figure 3:
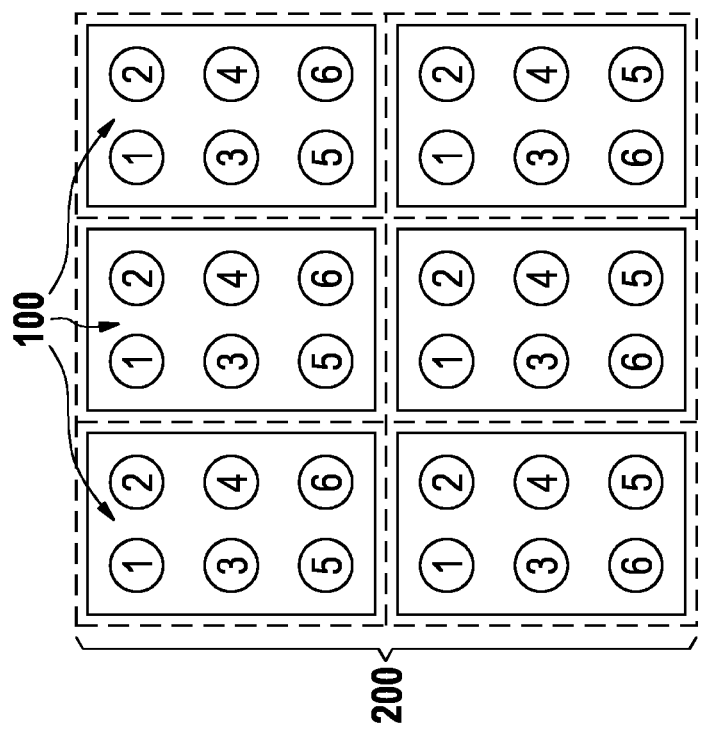

FIG. 3 shows a schematic top view of electrical carrier 120 (shown on the right in FIG. 3) and the outer side of first and second substrate 42, 12 of sensor system 200 according to the present invention, implemented for the example as a 2×3 array 200, for a first specific embodiment of the present invention. According to the first specific embodiment, a 3×2 array 200 of individual semiconductor components 100 is shown by way of example, each individual component (individual sensor element 100) including six electrical contacts, for example or preferably solder balls which periodically repeat themselves within array 200, corresponding contacts being identified in each case with the particular identical numbers from the set {1, 2, 3, 4, 5, 6}. In this case, the electrical contacts of the individual semiconductor components are not connected to one another within array 200. The electrical signals are therefore merged on electrical carrier 120, on which an arrangement of solder pads 130 prepared for the flip-chip mounting is situated and furthermore also strip conductors 150 are situated, which each connect identical pads (bus lines, substrate potential, supply voltage, etc.) to one another. Therefore, in this arrangement, the signals of individual semiconductor elements (or individual sensor elements 100) of array 200 are merged and possibly further processed on electrical carrier 120. One advantage of this variant is that all individual semiconductor chips (or individual sensor elements 100) on array 200 (or sensor system 200), including the metallic redistribution (in redistribution level 20 of second substrate 12 according to FIG. 1), are identical. As a result, the same wafer type may be separated as needed without changes of the wiring into arrays (sensor systems 200) of different sizes, thus, for example, 2×2, 3×3, and 4×4.

Figure 4:
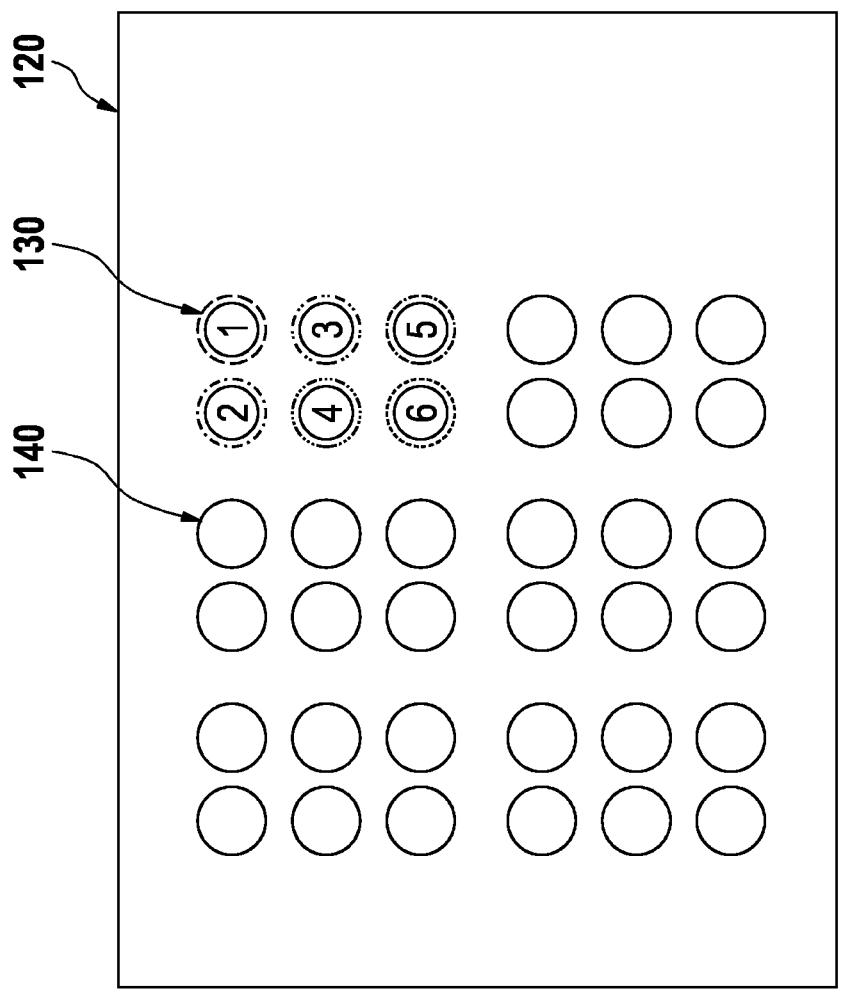
FIG. 4 shows a schematic top view of the electrical carrier or the outer side of the first or second substrate of the sensor system according to an example embodiment of the present invention, implemented for the example of a 2×3 array, for a second specific embodiment of the present invention.
Figure 4:
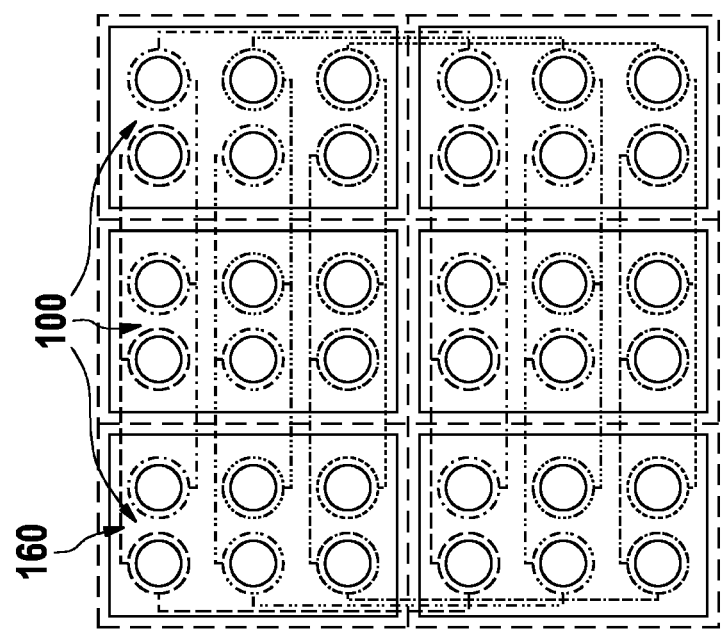

FIG. 4 shows a schematic top view of electrical carrier 120 (shown on the right in FIG. 4) and the outer side of first and second substrate 42, 12 of sensor system 200 according to the present invention, implemented for the example as a 2×3 array 200, for a second specific embodiment of the present invention. This second specific embodiment corresponds to an alternative, according to which it is possible to carry out a connection of equivalent electrical contacts of individual semiconductor components (or individual sensor elements 100) already on the array (or sensor system 200). A corresponding wiring diagram is again shown in FIG. 4 for a 3×2 array (in this case the six contacts are shown by different types of lines, i.e., dashed, dotted, dot-dash, etc.). Strip conductors 150 connect electrical contacts of various individual sensor elements 100 of sensor system 200 here. This variant requires a dedicated redistribution on array 200, which is specific for the array dimension (a 2×2 array requires different wiring than, for example, a 4×4 array). However, the expenditure for this purpose is only very minor in comparison to the total expenditure for manufacturing semiconductor elements 100. Therefore, the wiring complexity for this purpose is significantly simplified on electrical carrier 120, since, as shown by way of example in FIG. 4, only six active contact pads 130 are still required and remaining solder contacts 140 are passive and are thus only used for the mechanical fixation of array 200. Since solder contacts generally have higher error risks with respect to reliability (for example, breakdown of solder balls due to aging, temperature, harsh environmental conditions) than redistributions, the reliability or quality may be enhanced by this arrangement in comparison to the arrangement of FIG. 3. Alternatively, to the arrangement of active contacts 130 of FIG. 4, it is also possible to arrange all the active contacts in the outermost ball row of array 200, in order to thus facilitate an automated solder point check during the final assembly of array 200.

Figure 5:
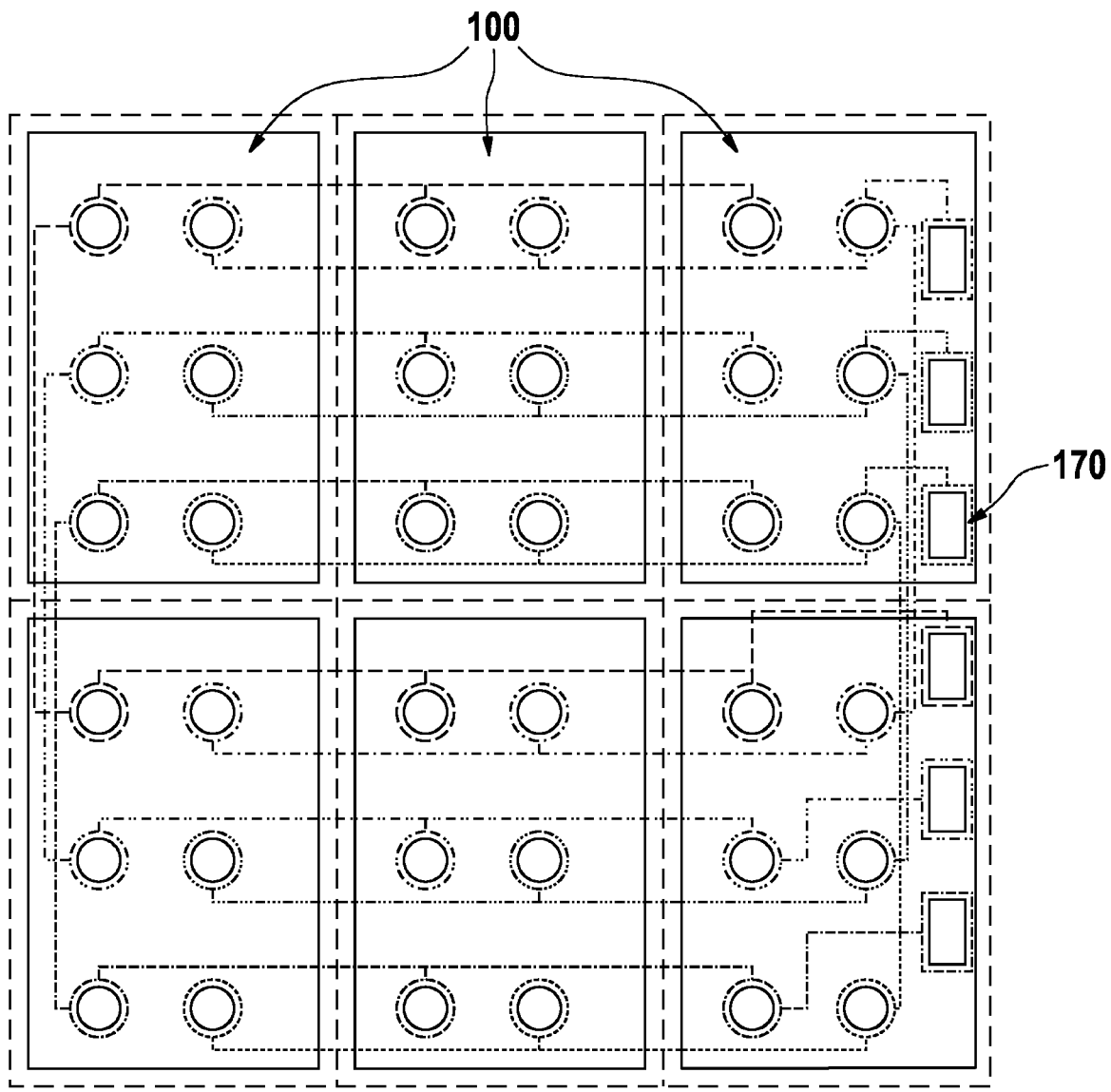
FIG. 5 shows a schematic top view of the outer side of the first or second substrate of the sensor system according to an example embodiment of the present invention, implemented for the example of a 2×3 array, for a third specific embodiment of the present invention.

FIG. 5 shows a schematic top view of the outer side of first and second substrate 42, 12 of the sensor system according to the present invention, implemented for the example as a 2×3 array, for a third specific embodiment of the present invention. According to the third specific embodiment, a redistribution is implemented (for example in redistribution level 20 of second substrate 12), by which the possibility is provided of implementing bond pads 170 for wire bonding. This option may be advantageous for specific applications and housing forms. Risks which are linked to the flip-chip mounting, for example, solder ball disruption and delamination, may thus be avoided. It may also be necessary for the function in the case of an array 200 made up of sensors having media access, for example, pressure sensors or gas sensors, to dispense with the flip-chip mounting.

The electrical connection of array 200 according to the present invention or sensor system 200 according to the present invention preferably takes place to a special ASIC or microcontroller (not shown), in which the signal processing is carried out. Various types of signal processing are possible, for example, arithmetic averaging, weighted averaging, a plausibility check, inserting or suppressing signals of individual semiconductor components or individual sensor elements 100. Moreover, additional pieces of information may be obtained by data fusion or data analysis from array 200, which individual semiconductor component 100 or individual sensor element 100 cannot supply.

Additional pieces of information which the individual semiconductor component cannot supply are particularly preferably obtained from the data of array 100. The following examples are listed in this regard:

in a temperature sensor array 200, for example, reading out lateral temperature gradients by way of differences in the measured temperature in the individual temperature sensors;

in an acceleration sensor array 200, for example, determining an axis of rotation by measuring centrifugal accelerations acting at different strengths on the individual acceleration sensors;

in a pressure sensor array 200, for example, determining the inclination of array 200 by reading out the differences in the barometric pressure between the individual pressure sensors (a very high resolution being required for this purpose, however, because pressure differences have to be resolved which correspond to height changes in the order of magnitude of 1 mm and less).

The signal averaging within the array particularly preferably takes place via arithmetic averaging. However, in specific cases, it may be preferred to carry out weighted averaging, for example if it turns out that semiconductor components 100 (or individual sensor elements 100) at the outer edge or in the corners of a 4×4 array supply greater errors, for example due to bending stress on the circuit board, than the semiconductor components located farther inward. In this case, it is preferred that the signals of the semiconductor components located farther inward are incorporated with greater weight in the signal averaging.

It is also preferred according to the present invention that different averaging methods are used within array 200 for different measured variables of individual semiconductor components 100. For example, it is possible in this way that in an acceleration sensor array 200, the noise is arithmetically averaged (since it is not dependent on the bending stress, thus the position of the individual sensor in the array), while the offset errors, in contrast, are weighted differently (since in the case of the offset error, the bending stress may act on the offset of the individual sensors as a function of the position).

According to the present invention, it is thus advantageously possible that an array 200 including multiple semiconductor components 100 (individual sensor elements 100) results in improved signal quality (performance) by way of suitable averaging. The improvements relate in particular to the noise, but also other errors, for example, offset and sensitivity errors of a sensor may be reduced by averaging. Array 200 may be scaled very easily, i.e., with little development expenditure, with respect to its performance. For example, if the noise is to be reduced by a factor of 2, the implementation of a 2×2 array from individual semiconductor components suggests itself (the noise power density of the overall system decreases for a n×m array at $1/(n\times m)^{\wedge}0.5$. If a factor of 4 is required, 4×4 arrays may easily be cut out of the wafer or wafer stack (which is identical except for scribe lines). Because of the low development expenditure, niche applications having increased performance requirements, for which a separate product development would not be cost-effective (due to high development costs at low piece counts), may be efficiently operated. Due to the preferred implementation as a chip scale package, the dimensions of the array made up of semiconductor components remain in a comprehensible framework which is acceptable for many installation size-sensitive applications. Example: An acceleration sensor may be implemented using present technologies and design concepts as an individual ASICAP component on an area of approximately 1 $mm^2$ with a power noise density of approximately 100 µg/sqrt (Hz). A 4×4 array made of such individual acceleration sensors would already reach a noise level of approximately 25 µg/sqrt (Hz) at a footprint of 16 $mm^2$. For comparison: In a construction of correspondingly many conventional acceleration sensors having a standard footprint of 2×2 $mm^2$ and sufficient distance between the individual sensors of, for example, 0.2 mm, a total area of approximately 80 $mm^2$, thus greater by a factor of 5, would be required. Furthermore, it is advantageously possible according to the present invention that due to the redundancy of the signals of the individual semiconductor components (individual sensor elements 100), these may alternately be checked for plausibility. Function errors of individual semiconductor components within array 200 may therefore be recognized easily. This aspect may be enormously advantageous for safety-critical applications, for example, in the automobile (ESP systems . . . ). Implausible signals may be suppressed by the microcontroller, and are thus no longer taken into consideration for the signal averaging.

What is claimed is:

1. A sensor system, comprising:
   a plurality of individual and separate sensor elements, wherein each of the individual sensor elements is independently functional and the individual sensor elements of the sensor system are each formed in one piece from parts of a wafer or a vertically integrated wafer stack; and
   at least one separation structure between the individual and separate sensor elements,
   wherein the sensor system is configured, with respect to an evaluation of the individual and separate sensor elements, in such a way that an arithmetic averaging of measured values of the individual and separate sensor elements is carried out, and/or that a weighted averaging of the measured values of the individual and separate sensor elements is carried out,
   wherein the individual and separate sensor elements of the sensor system, with the exception of a connection via a substrate potential, are exclusively mechanically connected to one another or are only electrically connected to one another via a redistribution level.

2. The sensor system as recited in claim 1, wherein the separation structure is a scribe line.

3. The sensor system as recited in claim 1, wherein each of the individual sensor elements includes a first substrate having a micromechanical sensor structure and a second substrate having an associated evaluation circuit, the first and second substrates including main extension planes which are situated in parallel to one another, the first substrate and the second substrate being mechanically and electrically connected to one another and the first substrate and the second substrate at least partially overlap in a direction perpendicular to the main extension planes or form an at least partially sealed cavity within which in each case the micromechanical sensor structure of the individual sensor elements is situated.

4. The sensor system as recited in claim 3, wherein each of the individual and separate sensor elements includes a vertically integrated wafer stack made up of a first chip arrangement including the micromechanical sensor structure and the first substrate, and a second chip arrangement including the associated evaluation circuit and the second substrate.

5. The sensor system as recited in claim 4, wherein the first and second substrates and/or the first and second chip arrangements are electrically connected to one another using vias and/or the first or second substrate are electrically connected using vias to an outer side of the first or second substrate facing away from the first or second substrate.

6. The sensor system as recited in claim 3, wherein the sensor system includes an electrical carrier, which extends in parallel to the main extension planes of the first and second substrates, the individual and separate sensor elements being mechanically connected to the electrical carrier.

7. The sensor system as recited in claim 6, wherein the electrical carrier includes electrical strip conductors and/or a further redistribution level.

8. The sensor system as recited in claim 7, wherein the redistribution level is situated on a side of the second substrate facing away from the first substrate and includes bond pads.

9. The sensor system as recited in claim 1, wherein the individual and separate sensor elements are individually addressable via a bus system.

10. The sensor system as recited in claim 1, wherein at least a part of the individual and separate sensor elements are similar sensor elements.

11. The sensor system as recited in claim 10, wherein the similar sensor elements include inertial sensor elements or temperature sensor elements or pressure sensor elements or actuator elements.

\* \* \* \* \*